United States Patent
Kai et al.

(10) Patent No.: US 9,293,563 B2
(45) Date of Patent: Mar. 22, 2016

(54) SEMICONDUCTOR MEMORY DEVICE AND METHOD OF MANUFACTURING THE SAME

(71) Applicant: KABUSHIKI KAISHA TOSHIBA, Minato-ku (JP)

(72) Inventors: Tetsuya Kai, Yokohama (JP); Yoshio Ozawa, Yokohama (JP); Ryota Fujitsuka, Yokkaichi (JP); Yoshitaka Tsunashima, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 14/314,796

(22) Filed: Jun. 25, 2014

(65) Prior Publication Data

US 2014/0308789 A1      Oct. 16, 2014

Related U.S. Application Data (62) Division of application No. 13/052,177, filed on Mar. 21, 2011, now Pat. No. 8,796,757.

(30) Foreign Application Priority Data

Jun. 15, 2010    (JP) .................. 2010-136532

(51) Int. Cl.
*H01L 21/336* (2006.01)
*H01L 29/66* (2006.01)
(Continued)

(52) U.S. Cl.
CPC .... *H01L 29/66666* (2013.01); *H01L 27/11578* (2013.01); *H01L 27/11582* (2013.01); *H01L 29/66833* (2013.01); *H01L 29/7926* (2013.01)

(58) Field of Classification Search
CPC .................. H01L 29/66666; H01L 27/11578; H01L 29/7926; H01L 27/11582; H01L 29/66833
See application file for complete search history.

(56) References Cited

U.S. PATENT DOCUMENTS

| 4,961,833 A | * | 10/1990 | Sakai et al. | 257/253 |
| 2008/0012060 A1 | * | 1/2008 | Ding et al. | 257/314 |

(Continued)

FOREIGN PATENT DOCUMENTS

| JP | 2006-86674 | 3/2006 |
| JP | 2007-266143 A | 10/2007 |

(Continued)

OTHER PUBLICATIONS

Office Action issued Nov. 26, 2013 in Japanese Patent Application No. 2010-136532 (with English language translation).

*Primary Examiner* — Jarrett Stark
(74) *Attorney, Agent, or Firm* — Oblon, McClelland, Maier & Neustadt, L.L.P.

(57) ABSTRACT

According to one embodiment, a semiconductor memory device with memory cells each composed of a vertical transistor, comprises a silicon layer formed into a columnar shape on a silicon substrate, a gate insulating film part in which a tunnel insulating film, a charge storage layer, and a block insulating film are formed to surround the sidewall surface of the silicon layer, and a stacked structure part formed to surround the sidewall surface of the gate insulating film part and in which a plurality of interlayer insulating films and a plurality of control gate electrode layers are stacked alternately. The silicon layer, gate insulating film part, and control gate electrode layer constitute the vertical transistor. The charge storage layer has a region lower in trap level than a region facing the control gate electrode layer between the vertical transistors.

11 Claims, 5 Drawing Sheets

(51) Int. Cl.
*H01L 27/115* (2006.01)
*H01L 29/792* (2006.01)

(56) References Cited

U.S. PATENT DOCUMENTS

2009/0230458 A1* 9/2009 Ishiduki et al. ............... 257/324
2009/0261400 A1 10/2009 Ozawa et al.
2009/0294828 A1 12/2009 Ozawa et al.
2009/0294836 A1* 12/2009 Kiyotoshi ..................... 257/324

FOREIGN PATENT DOCUMENTS

JP 2009-146954 7/2009
JP 2010-021191 A 1/2010

* cited by examiner

SEMICONDUCTOR MEMORY DEVICE AND METHOD OF MANUFACTURING THE SAME

CROSS-REFERENCE TO RELATED APPLICATIONS

This application is a divisional of U.S. application Ser. No. 13/052,177 filed Mar. 21, 2011, and based upon and claims the benefit of priority from Japanese Patent Application No. 2010-136532, filed Jun. 15, 2010; the entire contents of each of which are incorporated herein by reference.

FIELD

Embodiments described herein relate generally to a semiconductor memory device which uses nonvolatile memory cells each composed of a vertical transistor and a method of manufacturing the same.

BACKGROUND

In recent years, a semiconductor memory device which uses nonvolatile memory cells each composed of a vertical transistor has been proposed. In this device, a control gate electrode layer (or a word line electrode layer) and an interlayer insulating film (or an inter-word-line insulating film layer) are deposited alternately and horizontally on the surface of a silicon substrate. In the stacked structure part, a trench is made in a direction perpendicular to the silicon substrate surface and a vertical transistor with an electrically-insulated charge storage layer is formed in the trench. This enables a high-density memory cell structure to be realized.

However, this type of device has the following problem: charge storage layers are connected between memory cells vertically adjacent to one another, permitting cell storage charges to move into adjacent cells, which deteriorates the charge retention characteristic. Unlike an ordinary memory cell structure, it is very difficult to isolate charge storage layers between adjacent cells in a memory cell structure which uses vertical transistors.

DETAILED DESCRIPTION

In general, according to one embodiment, a semiconductor memory device with memory cells each composed of a vertical transistor comprises a silicon layer which is formed into a columnar shape on a silicon substrate, a gate insulating film part in which a tunnel insulating film, a charge storage layer, and a block insulating film are formed so as to surround the sidewall surface of the silicon layer, and a stacked structure part which is formed on the silicon substrate so as to surround the sidewall surface of the gate insulating film part and in which a plurality of interlayer insulating films and a plurality of control gate electrode layers are stacked alternately one on top of another. The silicon layer, gate insulating film part, and control gate electrode layer constitute the vertical transistor. The charge storage layer has a region lower in trap level than a region facing the control gate electrode layer between the vertical transistors vertically adjacent to one another.

Hereinafter, the details of the invention will be explained with reference to embodiments shown in the accompanying drawings.

First Embodiment

Figure 1:
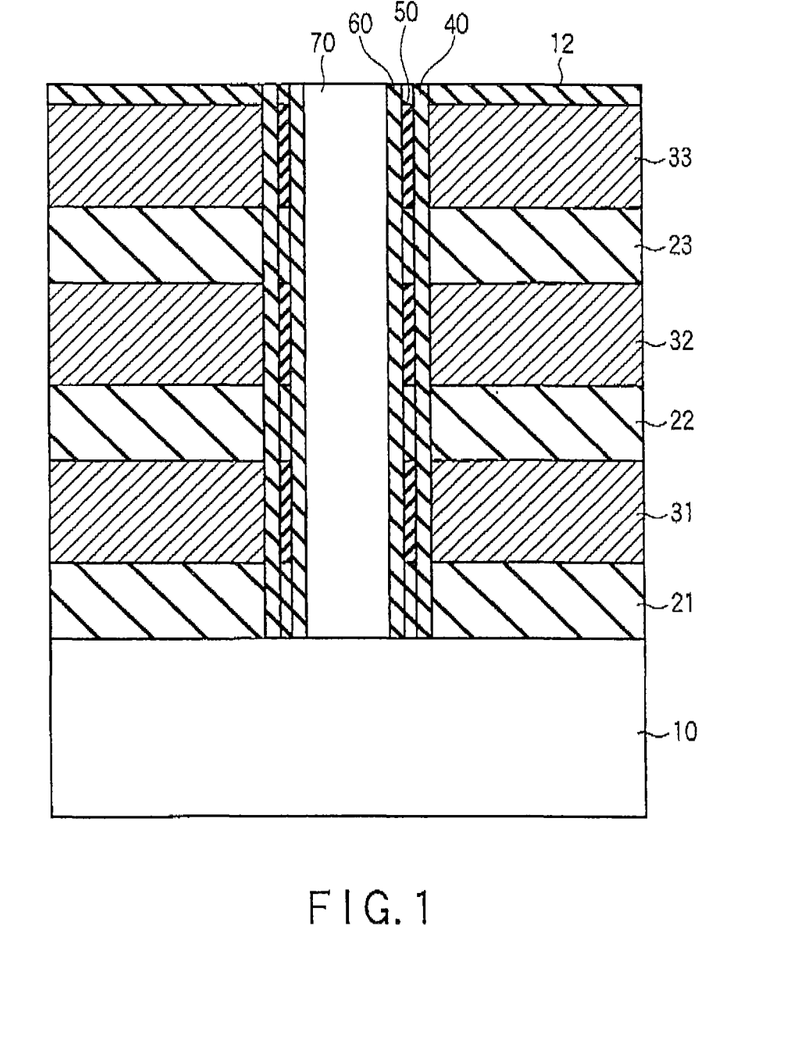
FIG. 1 is a sectional view of an element structure of a nonvolatile semiconductor memory device according to a first embodiment.

FIG. 1 is a sectional view of an element structure of a nonvolatile semiconductor memory device according to a first embodiment.

On a silicon substrate 10, a columnar silicon layer 70 is formed in a direction perpendicular to the surface of the substrate 10. Although only one silicon layer 70 is shown in FIG. 1, a plurality of columnar silicon layers are actually formed in a matrix in an X direction and a Y direction perpendicular to the X direction on the substrate 10.

A gate insulating film part is formed so as to surround the side of the silicon layer 70. Specifically, a tunnel insulating film 60 composed of a silicon dioxide film, a charge storage layer 50 composed of a silicon nitride film, and a block insulating film 40 composed of a silicon dioxide film are formed in that order along the sidewall surface of the silicon layer 70.

A stacked structure part formed by stacking a plurality of interlayer insulating films 20 (21, 22, 23) and a plurality of control gate electrode layers 30 (31, 32, 33) alternately one on top of another on the substrate 10 so as to surround the gate insulating film part. Specifically, control gate electrode layers 31, 32, 33 are formed above the silicon substrate 10 so as to be horizontal to the substrate surface, with interlayer insulating films 21, 22, 23 intervening between the control gate electrode layers 31, 32, 33 so as to isolate the layers 31, 32, 33 electrically from one another. The interlayer insulating films 20 are silicon dioxide films and the control gate electrode layers 30 are polysilicon films. The control gate electrode layers 30 are to serve as word lines of a memory cell array.

The basic configuration explained so far is the same as a general configuration of a BiCS (Bit Cost Scalable) nonvolatile semiconductor memory device. In the basic configuration, a plurality of vertical transistors each having a charge storage layer 50 (or nonvolatile memory cells) have been formed. Transistors vertically adjacent to one another share a source and a drain, thereby constituting a NAND cell unit.

In this configuration, the charge storage layers 50 are connected between memory cells vertically adjacent to one another, permitting cell storage charges to move into adjacent cells, which causes the problem of deteriorating the charge retention characteristic.

Therefore, in the first embodiment, the charge storage layers 50 are isolated from one another between adjacent cell transistors in the aforementioned configuration. Specifically, the charge storage layers 50 are segmentalized between memory cells vertically adjacent to one another. In this part, the same silicon dioxide film as that of the block insulating film 40 or tunnel insulating film 60 has been formed.

With this configuration, since the memory cells are isolated from one another with silicon dioxide films without permitting the charge storage layer 50 to be connected consecutively between memory cells vertically adjacent to one another, trap levels can be eliminated (or decreased) between adjacent cells in a charge storage layer region. Therefore, charges injected into a memory cell can be prevented from moving into adjacent cells, which enables the charge retention characteristic to be improved.

Next, a method of manufacturing a nonvolatile semiconductor memory device of the first embodiment will be explained with reference to FIGS. 2A to 2H and FIGS. 3A to 3C.

Figure 2A:
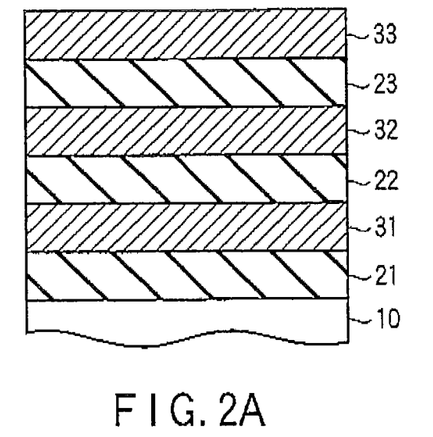
FIGS. 2A, 2B, 2C, 2D, 2E, 2F, 2G, and 2H are sectional views to explain the process of manufacturing a nonvolatile semiconductor memory device according to the first embodiment.

First, as shown in FIG. 2A, a stacked structure part formed by stacking interlayer insulating films 20 (21, 22, 23) and control gate electrode layers 30 (31, 32, 33) alternately one on top of another is formed on the silicon substrate 10. Specifically, on the substrate 10, the interlayer insulating film 21, control gate electrode layer 31, interlayer insulating film 22, control gate electrode layer 32, interlayer insulating film 23, control gate electrode layer 33 are stacked one on top of another in that order. Although FIG. 2A shows a three-layer structure of the control gate electrodes 30, the control gate electrodes 30, of course, may have a four or more layer structure. The film thickness of the interlayer insulating films 20 and control gate electrode layers 30 is, for example, several tens of nanometers.

As the control electrode layers 30, a phosphorated silicon film is formed by introducing monosilane ($SiH_4$) and phosphine ($PH_3$) into a reacting furnace at 450° C. to 650° C. and using CVD method at a pressure of 0.1 to 1 Torr. As the interlayer insulating films 20, a silicon dioxide film is formed by introducing dichlorosilane ($SiH_2Cl_2$) and nitrogen monoxide ($N_2O$) into a reacting furnace at 600° C. to 800° C. and using CVD method at a pressure of 0.1 to 5 Torr.

Here, the efficiency of introduction of oxygen into the charge storage layer 40 via an interlayer insulating film 20 explained later may be increased by forming a low-density insulating film as the interlayer insulating film 20. A method of forming a low-density insulating film is to form a silicon dioxide film by CVD method using TEOS gas or form a coating film made of, for example, polysilazane.

Figure 2B:
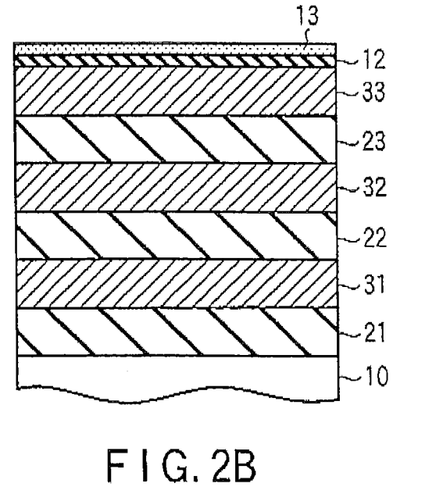

Next, as shown in FIG. 2B, a silicon nitride film 12 is deposited on the top control gate electrode layer 33 as a trench formation hard mask. Specifically, a silicon nitride film 12 is deposited by introducing dichlorosilane ($SiH_2Cl_2$) and ammonia ($NH_3$) into a reacting furnace at 600° C. to 800° C. and using CVD method at a pressure of 0.1 to 1 Torr. Then, a photoresist film 13 is formed on the silicon nitride film 12.

Figure 2C:
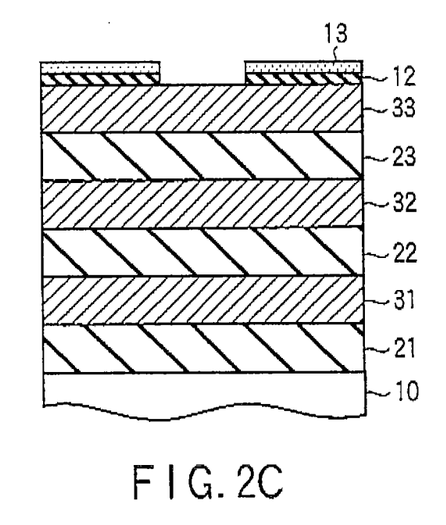

Next, as shown in FIG. 2C, an opening is made in the photoresist film 13 by photolithography only when a trench is to be made. Then, after the silicon nitride film 12 under the opening made in the photoresist film 13 by dry etching is removed, the photoresist film 13 is removed.

Figure 2D:
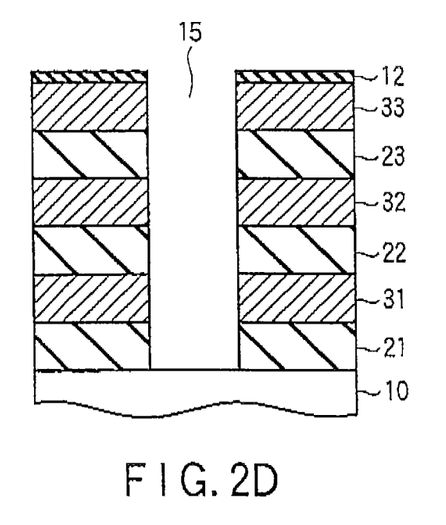
Figure 3A:
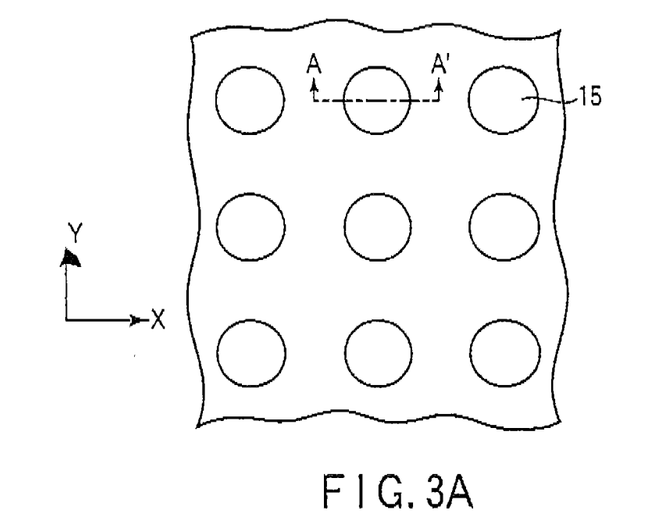
FIGS. 3A, 3B, and 3C are plan views to explain the process of manufacturing a nonvolatile semiconductor memory device according to the first embodiment.
Figure 3B:
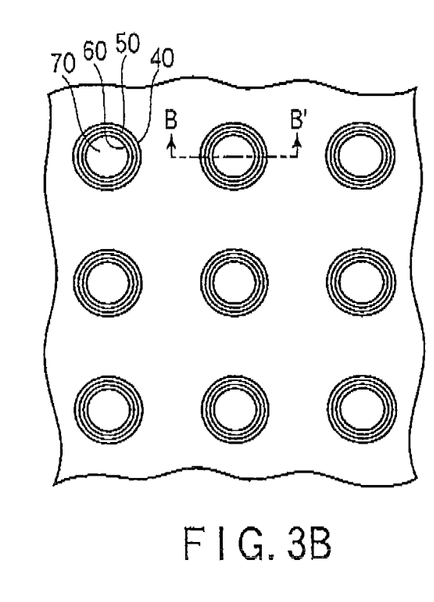
Figure 3C:
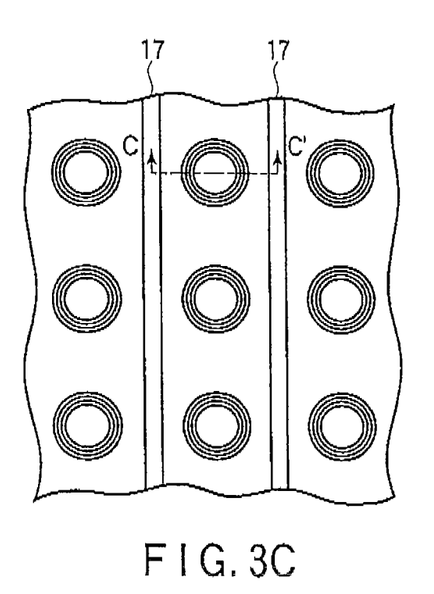

Next, as shown in FIG. 2D, with the silicon nitride film 12 as a hard mask, a stacked film of the interlayer insulating films 20 and control gate electrode layers 30 is selectively etched by Reactive Ion Etching (RIE), thereby forming a cell trench 15. This state is shown in a plan view of FIG. 3A. FIG. 2D corresponds to a sectional view taken along line A-A' of FIG. 3A. As shown in FIG. 3A, cell trenches 15 are arranged in a matrix in a horizontal direction (X direction) on paper and a vertical direction (Y direction) perpendicular to the X direction on paper.

Here, It is desired that the forming direction in the cell trench becomes the surface and the vertical direction of the substrate 10. However, even if the forming direction shifts somewhat from the surface and the vertical direction, it is unquestionable.

Figure 2E:
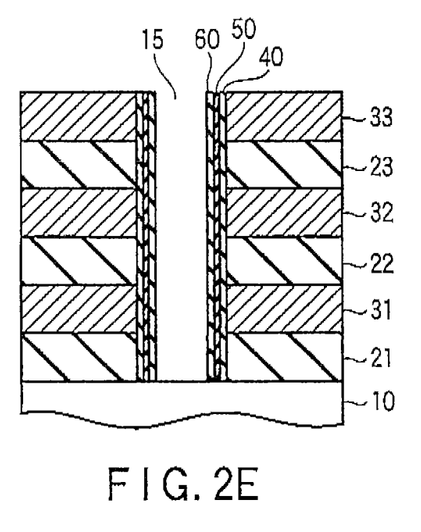

Next, after the silicon nitride film 12 acting as a hard mask is removed by wet etching, a block insulating film 40, a charge storage layer 50, and a tunnel insulating film 60 are formed in that order on the sidewall surface of the cell trench 15 as shown in FIG. 2E. Here, the film thickness of the block insulating film 40 is, for example, 10 nm, the film thickness of the charge storage film 50 is, for example, 5 nm, and the film thickness of the tunnel insulating film 60 is, for example, 8 nm.

Specifically, first, a silicon dioxide film is deposited on the sidewall surface of the trench 15 by introducing dichlorosilane ($SiH_2Cl_2$) and nitrogen monoxide ($N_2O$) into a reacting furnace at 600° C. to 800° C. and using CVD method at a pressure of 0.1 to 5 Torr. By doing this, a block insulating film 40 is formed. Then, a silicon nitride film is formed on the sidewall surface of the block insulating film 40 by introducing dichlorosilane ($SiH_2Cl_2$) and ammonia ($NH_3$) into a reacting furnace at 600° C. to 800° C. and using CVD method at a pressure of 0.1 to 1 Torr. By doing this, a charge storage layer 50 is formed. Thereafter, a silicon dioxide film is formed on the sidewall surface of the charge storage layer 50 by introducing dichlorosilane ($SiH_2Cl_2$) and nitrogen monoxide ($N_2O$) into a reacting furnace at, for example, 600° C. to 800° C. and using CVD method at a pressure of 0.1 to 5 Torr. By doing this, a tunnel insulating film 60 is formed.

The silicon nitride film 12 acting as a hard mask does not necessarily need to be removed before the formation of the gate insulating film part and may be left as a protective insulating film.

Figure 2F:
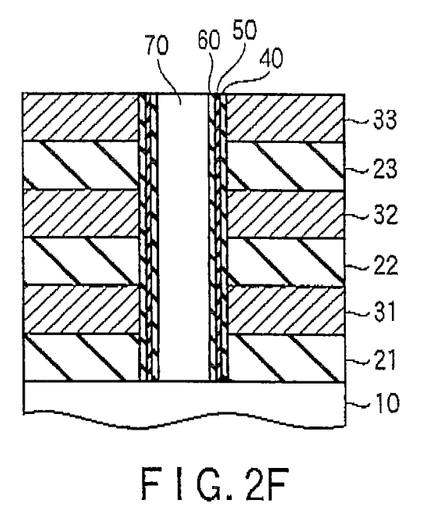

Next, as shown in FIG. 2F, a silicon layer 70 is formed so as to be buried in the cell trench 15 by introducing monosilane ($SiH_4$) into a reacting furnace at 450° C. to 650° C. and using CVD method at a pressure of 0.1 to 1 Torr. This state is shown in a plan view of FIG. 3B. FIG. 2F corresponds to a sectional view taken along line B-B' of FIG. 3B.

By the processes so far, a plurality of nonvolatile semiconductor memory cells each composed of a vertical transistor which has the tunnel insulating film 60, charge storage layer 50, block insulating film 40, and control gate electrode layer 30 so as to surround the columnar silicon layer 70.

Figure 2G:
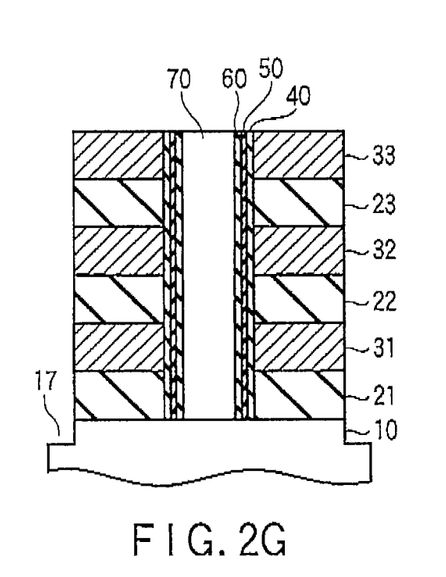

Next, in the first embodiment, as shown in FIG. 2G, element isolating trenches 17 are made in regions adjacent to the cell trench 15. This state is shown in a plan view of FIG. 3C. FIG. 2G corresponds to a sectional view taken along line C-C' of FIG. 3C. Element isolating trenches 17 are made on both sides of the trench 15 so as to sandwich the trench 15 between them. That is, an element isolating trench is made between cell trenches 15 adjacent to one another in the X direction.

Figure 2H:
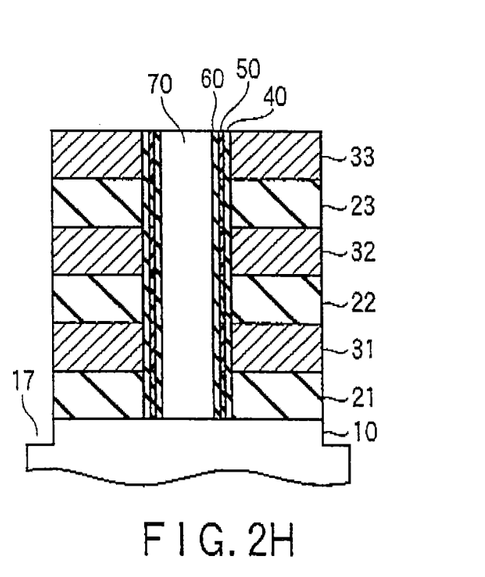

Next, the adjacent cell region of the charge storage layer 50 is oxidized as shown in FIG. 2H by heat treatment in an oxidizing atmosphere, for example, by steam oxidation at a temperature of not lower than 700° C. Specifically, oxygen is supplied via the interlayer insulating film 20 to the charge storage layer 50 composed of a silicon nitride film, with the result that a part facing the interlayer insulating film 20 of the charge storage layer 50 becomes an oxide film or an oxynitride film. As a result, the charge storage layer 50 is isolated by a silicon dioxide film or a silicon oxynitride film between memory cells vertically adjacent to one another.

Here, the charge storage layer 50 does not necessarily need to become a complete silicon dioxide film or a silicon oxynitride film between memory cells and may partially become an oxide film or an oxynitride film or have a part where a nitride film is left as it is. That is, the charge storage layer 50 does not necessarily need to be isolated completely between adjacent cells and has only to have a region lower in trap level between adjacent cells.

As described above, according to the first embodiment, the charge storage layer 50 in the region between memory cells vertically adjacent to one another is oxidized, turning into a silicon dioxide film or a silicon oxynitride film, with the result that the charge storage layer 50 is isolated between adjacent cells. Therefore, charges stored in the charge storage layer 50 of the memory cell part can be prevented from moving into adjacent cells, enabling the charge retention characteristic to be improved. In addition, this advantage can be realized by only adding an ordinary etching process and an oxidation treatment without requiring a special process, a special material, or the like.

Furthermore, use of an insulating film lower in density than an ordinary silicon dioxide film as the interlayer insulating film 20 enables the efficiency of introduction of oxygen into the charge storage layer 50 via the interlayer insulating film 20 to be increased. In this case, the charge storage layer 50 between adjacent cells can be oxidized more reliably.

Second Embodiment

Next, another method of manufacturing a nonvolatile semiconductor memory device of FIG. 1 will be explained.

In a second embodiment, a silicon nitride film is oxidized in a storage layer region of the sidewall part of an interlayer insulating film 20 making use of moisture in the interlayer insulating film 20, thereby isolating the charge storage layer 50.

First, as shown in FIGS. 2A to 2D, interlayer insulating films 20 and control gate electrode layers 30 are stacked alternately one after another and a silicon nitride film 12 and a photoresist film 13 are formed as a trench formation hard mask in the end. The materials for the individual films and the method of forming the films are the same as in the first embodiment. Then, an opening is made in the photoresist film 13. After the silicon nitride film 12 under the opening made in the photoresist film 13 is removed, the photoresist film 13 is removed. Thereafter, by RIE method using the silicon nitride film 12 as a hard mask, trenches are made in the stacked film of the interlayer insulating films 20 and control gate electrodes 30.

Next, as shown in FIGS. 2E to 2G, a block insulating film 40, a charge storage layer 50, and a tunnel insulating film 60 are deposited on the internal wall surface of a cell trench 15. Then, a silicon layer 70 is formed so as to be buried in the trench. Then, element isolating trenches 17 are made in regions adjacent to the cell trench 15. The processes so far are the same as in the first embodiment.

Next, in the second embodiment, a washing process with a wet cleaning machine supplies moisture to the interlayer insulating film 20 via the element isolating trench 17, causing the interlayer insulating film 20 to absorb moisture. Another method of causing the interlayer insulating film 20 to absorb moisture is to expose the interlayer insulating film 20 to an atmosphere containing water vapor to cause the film 20 to absorb moisture. Then, the interlayer insulating film 20 is put in an reacting furnace at 400 to 1100° C. for heat treatment, thereby evaporating the moisture absorbed into the interlayer insulating film 20. The resulting steam oxidizes the charge storage layer 50 adjacent to the interlayer insulating film 20, causing the region between adjacent cells of the charge storage layer 50 to become a silicon dioxide film or a silicon oxynitride film.

Here, the region between adjacent cells of the charge storage layer 50 need not become a silicon dioxide film or a silicon oxynitride film completely. The region between adjacent cells has only to partially become an oxide film or an oxynitride film and may have a part where a nitride film is left as it is. That is, the charge storage layer 50 does not necessarily need to be isolated completely between adjacent cells and has only to have a region lower in trap level between adjacent cells.

As described above, in the second embodiment, since the charge storage layer 50 in the region between adjacent cells becomes a silicon dioxide film or a silicon oxynitride film, the trap density decreases in the region between adjacent cells. Therefore, as in the first embodiment explained above, the escape of charges in a traverse direction can be reduced, which improves the charge retention characteristic.

Here, the moisture absorption of the interlayer insulating film 20 may be increased by using as the interlayer insulating film 20 a highly hygroscopic lanthanum oxide film (LaOx), boron silicate glass (BSG), boron phosphorus silicate glass (BPSG), fluorosilicate glass (FSG), a coating organic silicon dioxide film, such as SOG, a porous silicon dioxide film, or the like. In this case, the amount of moisture evaporation by heat treatment is large and therefore, the charge storage layer 50 between adjacent cells can be oxidized more reliably.

Third Embodiment

Next, still another method of manufacturing a nonvolatile semiconductor memory device of FIG. 1 will be explained with reference to FIGS. 4A and 4B.

In a third embodiment, the charge storage layer 50 is isolated by etching the gate insulating film part including the charge storage layer 50 between adjacent cells instead of oxidizing the charge storage layer 50 between adjacent cells.

First, as shown in FIGS. 2A to 2D, interlayer insulating films 20 and control gate electrode layers 30 are stacked alternately one on top of another and a silicon nitride film 12 and a photoresist film 13 are formed as a trench formation hard mask in the end. The materials for the individual films and the method of forming the films are the same as in the first embodiment. Then, an opening is made in the photoresist film 13. After the silicon nitride film 12 under the opening made in the photoresist film 13 is removed, the photoresist film 13 is removed. Thereafter, by RIE method using the silicon nitride film 12 as a hard mask, trenches are made in the stacked film of the interlayer insulating films 20 and control gate electrodes 30.

Next, as shown in FIGS. 2E to 2G, a block insulating film 40, a charge storage layer 50, and a tunnel insulating film 60 are deposited on the internal wall surface of a cell trench 15. Then, a silicon layer 70 is formed so as to be buried in the trench. Then, element isolating trenches 17 are made in regions adjacent to the cell trench 15. The processes so far are the same as in the first and second embodiments.

Figure 4A:
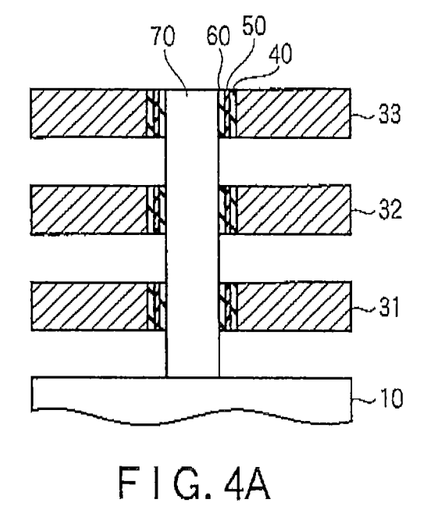
FIGS. 4A and 4B are sectional views to explain the process of manufacturing a nonvolatile semiconductor memory device according to a third embodiment.

Next, in the third embodiment, as shown in FIG. 4A, wet etching is performed, thereby removing the interlayer insulating film 20, block insulating film 40, charge storage layer 50, and tunnel insulating film 60 in the region between adjacent cells. That is, when etchant whose etching selection ratio between polysilicon and a silicon dioxide film and between polysilicon and a silicon nitride film is great is used, the interlayer insulating film 20, block insulating film 40, charge storage layer 50, and tunnel insulating film 60 can be selectively etched with the control gate electrode layer 30 as a mask.

Figure 4B:
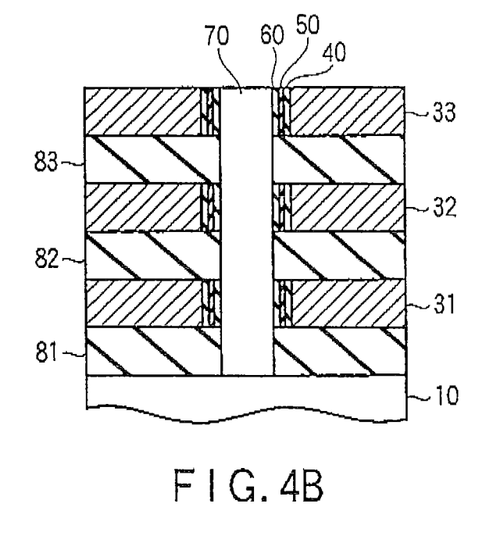

Next, as shown in FIG. 4B, a region removed by wet etching is filled with interlayer insulating films 80 (81, 82, 83) composed of silicon dioxide films, with the result that the region between adjacent cells of the charge storage layer 50 becomes a silicon dioxide film. The formation of the buried interlayer insulating films 80 can be realized by CVD method as in the formation of the interlayer insulating film 20 explained above.

As described above, with the third embodiment, after not only the interlayer insulating film 20 between control gate electrodes 30 vertically adjacent to each other but also the block insulating film 40, charge storage layer 50, and tunnel insulating film 60 in the same location as the interlayer insulating film 20 are removed, interlayer insulating films 80 are formed again, thereby isolating the charge storage layer 50 between adjacent cells. Therefore, charges stored in the charge storage layer 50 of the memory cell part can be prevented from moving into adjacent cells, which produces the same effect as in the first embodiment.

By wet etching in FIG. 4A, the interlayer insulating film 20, block insulating film 40, charge storage layer 50, and tunnel insulating film 60 cannot be removed completely and a part of them might be left. However, if a part of the charge storage layer 50 has been removed, the movement of stored charges into adjacent cells can be suppressed. That is, even if the selective etching of the interlayer insulating film 20, block insulating film 40, charge storage layer 50, and tunnel insulating film 60 has not been performed completely, the same effect as in the first embodiment can be obtained.

In addition, since a silicon dioxide film is newly formed in the part where the gate insulating film part has been removed between adjacent cells instead of the oxidation of the silicon nitride film via the interlayer insulating film 20, the charge storage layer 50 can be isolated more reliably.

Modification

The invention is not limited to the above embodiments. While in the embodiments, cell trenches have been circular, they are not necessarily circular and may be elliptical or rectangular. In addition, an element isolating trench is not necessarily on either side of a cell trench and may be at least on one side of the cell trench.

In the embodiments, although only the memory cell part has been shown, a select transistor may be formed in the top layer to constitute a NAND cell unit. In addition, the number of memory cells constituting a NAND cell unit may be increased by electrically connecting the bottoms of adjacent silicon layers to one another with a diffusion layer or the like.

Furthermore, the material for interlayer insulating films is not limited to a silicon dioxide film and may be changed as needed. When the charge storage layer is oxidized via the interlayer insulating film as in the first embodiment, the interlayer insulating film has only to be a low-density insulating film that allows oxygen to pass through easily. When the charge storage layer is oxidized making use of moisture in the interlayer insulating film as in the second embodiment, the interlayer insulating film has only to be a highly hygroscopic insulating film. When the interlayer insulating film is buried again after etching is performed as in the third embodiment, the interlayer insulating film has only to be an insulating film which assures a high etching selection ratio between a control gate electrode material, such as polysilicon, and the material for the interlayer insulating films. The material for and film thickness of each part may be changed according to the specifications as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor memory device, comprising:
   forming, on a silicon substrate, a stacked structure part in which a plurality of interlayer insulating films and a plurality of control gate electrode layers are stacked one on top of another alternately;
   forming a cell trench in the stacked structure part so as to attain the surface of the substrate;
   forming a block insulating film, a charge storage layer, and a tunnel insulating film in that order along the sidewall of the cell trench;
   forming a silicon layer in the cell trench so as to be buried in contact with the tunnel insulating film;
   forming an element isolating trench in the gate electrode layer and interlayer insulating film in the vicinity of the cell trench;
   isolating the charge storage layer in a direction perpendicular to the surface of the substrate by etching the interlayer insulating film, block insulating film, charge storage layer, and tunnel insulating film with the control gate electrode as a mask after the formation of the element isolating trench; and
   forming a new interlayer insulating film in a part where the interlayer insulating film, block insulating film, charge storage layer, and tunnel insulating film have been etched so as to be buried in the part.

2. The method according to claim 1, wherein the cell trench comprises a plurality of cell trenches, the cell trenches arranged in rows and columns and the element isolating is formed between neighboring ones of the columns.

3. The method according to claim 1, wherein the cell trench and element isolating trench are formed by RIE and the interlayer insulating film, block insulating film, charge storage layer, and tunnel insulating film are etched by wet etching.

4. A method of manufacturing a semiconductor memory device, comprising:
   forming a stacked structure part in which a plurality of first films and a plurality of second films are alternately stacked above a silicon substrate, the first films having an etching selectivity to the second films;
   forming a plurality of openings, each opening being circular or elliptical in a plan view, in the stacked structure part in a direction substantially perpendicular to a surface of the silicon substrate;
   forming a gate insulating film part including at least a charge storage layer along a sidewall of each of the plurality of openings;
   forming a semiconductor layer in contact with the gate insulating film part in each of the plurality of openings;
   forming an isolating trench through the first films and the second films in vicinity of the openings; and
   isolating the charge storage layer in the direction substantially perpendicular to the surface of the silicon substrate, by etching the plurality of first films of the stacked structure part and at least the charge storage layer in the gate insulating part through the isolating trench.

5. The method according to claim 4, wherein the plurality of openings are arranged in rows and columns and the isolating trench is formed between neighboring ones of the columns.

6. The method according to claim 4, wherein the plurality of openings and the isolating trench are formed by RIE and the plurality of first films and the charge storage layer are etched by wet etching.

7. A method of manufacturing a semiconductor memory device, comprising:

forming an object to be processed, which comprises a stacked structure part in which a plurality of control gate electrode layers and a plurality of inter-gate layers are alternately stacked above a silicon substrate, a columnar member formed in the stacked structure part in a direction substantially perpendicular to a surface of the silicon substrate, the member including a semiconductor layer, to be accompanied by a gate insulating film part formed between the semiconductor layer and the stacked structure part, the gate insulating film part including at least a charge storage layer and being formed along a sidewall of the semiconductor layer;

after the forming the object, forming an isolating trench through the stacked structure part in vicinity of the columnar member;

removing, through the isolating trench, each of the inter-gate layers between the control gate electrode layers neighboring in the direction substantially perpendicular to the surface of the silicon substrate; and isolating the charge storage layer in the direction substantially perpendicular to the surface of the silicon substrate, by etching the charge storage layer positioned at a same height as the removed inter-gate layers through the isolating trench.

8. The method according to claim 7, wherein a plurality of columnar members, each being the columnar member, are arranged in rows and columns and the isolating trench is formed between neighboring ones of the columns.

9. The method according to claim 7, wherein the isolating trench is formed by RIE.

10. The method according to claim 9, wherein the inter-gate layers are removed by wet etching.

11. The method according to claim 9, wherein the charge storage layer is etched by wet etching.

* * * * *